United States Patent
Drab et al.

(10) Patent No.: US 7,335,552 B2
(45) Date of Patent: Feb. 26, 2008

(54) ELECTRODE FOR THIN FILM CAPACITOR DEVICES

(75) Inventors: John J. Drab, Santa Barbara, CA (US); Thomas K. Dougherty, Playa del Rey, CA (US); Kathleen A. Kehle, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/147,093

(22) Filed: May 15, 2002

(65) Prior Publication Data

US 2003/0216017 A1 Nov. 20, 2003

(51) Int. Cl.
*H01L 21/8242* (2006.01)

(52) U.S. Cl. ............... 438/240; 438/253; 438/E21.648

(58) Field of Classification Search ................ 438/628, 438/635, 642–4, 650, 2, 6, 660, 3, 679, 680–6, 438/648, 656, 686, 768, 785, 239–240, 253, 438/396; 257/E21.648
See application file for complete search history.

(56) References Cited

U.S. PATENT DOCUMENTS

| | | | | |
|---|---|---|---|---|
| 5,142,438 | A * | 8/1992 | Reinberg et al. ............ 361/313 |
| 5,723,171 | A | 3/1998 | Cuchiaro et al. ............ 427/96 |
| 6,054,311 | A | 4/2000 | Davey et al. ............... 435/260 |
| 6,101,102 | A | 8/2000 | Brand et al. ................ 363/15 |
| 6,103,400 | A | 8/2000 | Yamada et al. ............. 428/627 |
| 6,180,481 | B1 * | 1/2001 | Deboer et al. ............. 438/396 |
| 6,238,934 | B1 * | 5/2001 | Yang ........................ 438/3 |
| 6,461,914 | B1 * | 10/2002 | Roberts et al. ............ 438/253 |
| 6,492,242 | B1 * | 12/2002 | See et al. .................. 438/393 |
| 6,515,338 | B1 * | 2/2003 | Inumiya et al. ............ 257/368 |
| 6,524,868 | B2 * | 2/2003 | Choi et al. ................. 438/3 |
| 6,537,875 | B2 * | 3/2003 | Won et al. ................. 438/254 |
| 6,676,844 | B2 * | 1/2004 | Lee et al. .................. 216/27 |
| 2001/0019874 | A1 | 9/2001 | Uemoto |
| 2002/0122284 | A1 * | 9/2002 | Yang et al. ................ 361/302 |
| 2003/0183901 | A1 * | 10/2003 | Kanda et al. .............. 257/510 |

FOREIGN PATENT DOCUMENTS

| | | |
|---|---|---|
| EP | 0 785 579 | 7/1997 |
| GB | 1 544 506 | 4/1979 |
| JP | 58-074079 A * | 5/1983 |

OTHER PUBLICATIONS

Pierson, H.O., Handbook of Chemical Vapor Deposition (CVD):Principles, Technology, and Applications, 1999, Noyes Pubications, 2nd Edition, pp. 138-143.*

* cited by examiner

*Primary Examiner*—Hoai v Pham
(74) *Attorney, Agent, or Firm*—Leonard A. Alkov

(57) ABSTRACT

A method of forming a conductor on a substrate including steps of depositing tantalum on a glass layer of the substrate; oxidizing the tantalum; and depositing a noble metal on the oxidized tantalum to form the conductor. The method can be used to form a ferroelectric capacitor or other thin film ferroelectric device. The device can include a substrate comprising a glass layer; and an electrode connected to the glass layer. The electrode comprising can include a noble metal connected to the glass layer by an adhesion layer comprising $Ta_2O_5$.

22 Claims, 2 Drawing Sheets

US 7,335,552 B2

ELECTRODE FOR THIN FILM CAPACITOR DEVICES

GOVERNMENT RIGHTS

This invention was made with government support under contract No. F33615-98-2-1357 awarded by the United States Department of the Air Force. The government has certain rights in this invention.

BACKGROUND OF THE INVENTION

1. Field of the Invention

The present invention relates to thin film capacitor devices or ferroelectric devices and, more particularly, to a method of forming an electrode on a glass layer of a substrate.

2. Brief Description of Prior Developments

Platinum (Pt) is commonly used as an electrode material for thin-film ferroelectric devices. This is due to its resistance to oxidation at temperatures above 600° C. in oxygen ($O_2$); an environment which is required to obtain good electrical characteristics from materials such as $(BaSr)TiO_3$ (BST), $(PbZr)TiO_3$ (PZT), $SrBi_2Ta_2O_9$ (SBT), $SrBi_2Nb_2O_9$ (SBN), $SrBi_2(TaNb)_2O_9$ (SBTN) and others. Devices using these materials are frequently made using oxidized silicon wafers as a substrate.

Adhesion of a platinum electrode to the oxide of the silicon wafer has always been a problem. The problem has been exacerbated due to the unique properties of platinum and challenges of thin film ferroelectric processing. Platinum has a tendency to plastic flow in response to stress at temperatures above 600° C. Ferroelectric thin film deposition is frequently performed using spin-on methods which result in a very high tensile stress due to film shrinkage as it is sintered. The ferroelectric material can contain metals such as Bi. These metals can alloy with the platinum.

The ferroelectric processes often incorporate long anneals in $O_2$ at elevated temperature to improve performance. Even if the platinum adheres to the substrate, these processes frequently cause the formation of hillocks or bumps on the surface of the platinum electrode. These hillocks can cause localized high electric fields, high leakage, and early breakdown. In more severe cases, hillocks can be large enough to directly short out the ferroelectric device or combine with other defects in the film to short out the devices resulting in reduced yield or unusable devices.

Historically a thin film of titanium (Ti) has been added between the platinum and the oxide of the silicon wafer. This titanium layer is about 10% of the thickness of the platinum electrode and greatly improves adhesion of the platinum to the oxide. An example of this electrode is given in U.S. Pat. No. 5,723,171. The use of a titanium adhesion layer has two major problems. First, the process windows are very narrow. Changes in anneal times or temperatures or changes in the thickness of the ferroelectric often require a re-optimization of the titanium and platinum layer thicknesses. Second, titanium is very mobile and can migrate through the platinum electrode causing degraded performance of the ferroelectric layer. This is a known problem with BST, SBT, SBTN and others where variations in film composition, due to titanium incorporation degrade film performance.

Other methods to improve adhesion have been employed with a wide variety of metallic layers such as Cr, Ta, Vd, Nb, Sr, Ru, Os, Pd (see U.S. Pat. Nos. 6,103,400 and 6,054,311). While these other metals may work over some range of conditions, these processes all suffer from either poor adhesion or from volume expansion of the adhesion layer due to oxidation during high temperature oxygen anneals which results in an unstable foundation for the platinum and limits their utility.

SUMMARY OF THE INVENTION

In accordance with one method of the present invention, a method of forming a conductor on a substrate is provided comprising steps of depositing tantalum on a glass layer of the substrate; oxidizing the tantalum; and depositing a noble metal on the oxidized tantalum to form the conductor.

In accordance with another method of the present invention, a thin film ferroelectric device is provided comprising a substrate comprising a glass layer; and an electrode connected to the glass layer. The electrode comprises a noble metal connected to the glass layer by an adhesion layer comprising $Ta_2O_5$.

In accordance with one aspect of the present invention, a thin film ferroelectric device is provided comprising a substrate comprising a glass layer; and an electrode connected to the glass layer. The electrode comprises a noble metal connected to the glass layer by an adhesion layer comprising $Ta_2O_5$.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

Figure 1:
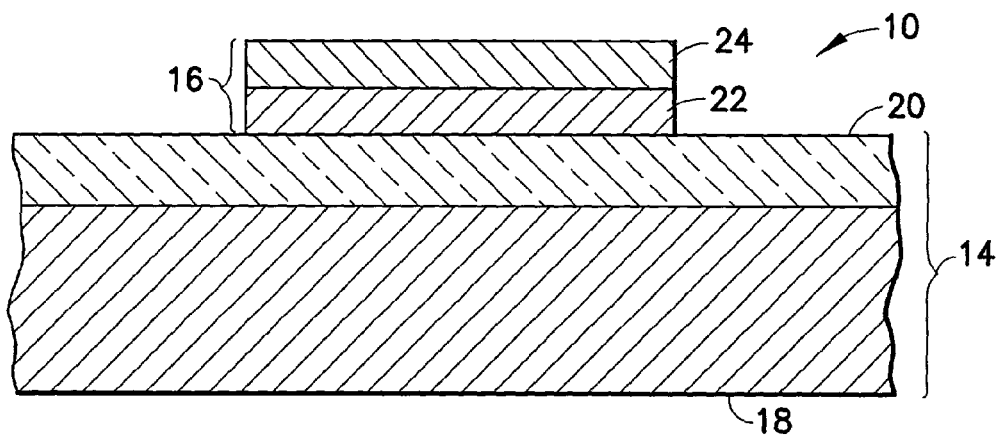
FIG. 1 is a schematic cross sectional diagram of a component incorporating features of the present invention.

Referring to FIG. 1, there is shown a diagram of a cross section of a subcomponent 10 incorporating features of the present invention. Although the present invention will be described with reference to the exemplary embodiment shown in the drawings, it should be understood that the present invention can be embodied in many alternate forms of embodiments. In addition, any suitable size, shape or type of elements or materials could be used.

The subcomponent 10 is generally intended to be used in fabricating a larger electrical component, such as a thin film ferroelectric device. For example, the component 10 could be used to fabricate a ferroelectric device, such as a ferroelectric capacitor 12 (see FIG. 5). The subcomponent 10 generally comprises a substrate 14 and an electrode 16.

The substrate 14, in the embodiment shown, is preferably a semiconductor wafer. However, in alternate embodiments, any suitable type of substrate could be provided. The substrate 14 generally comprises a base 18 and a top layer 20. The base 18 preferably comprises a 3-15 ohm-cm Phosphorous doped silicon substrate. However, any suitable type of base could be provided. In the embodiment shown, the top layer 20 is comprised of glass. In a preferred embodiment, the glass layer 20 comprises silicon dioxide ($SiO_2$). For example, the glass layer 20 could comprise 5000 Å thick wet silicon oxide. However, in alternate embodiments, the substrate 14 could be comprised of any suitable type of a top layer.

The electrode 16, in the embodiment shown, generally comprises an adhesion layer 22 and a electrical conductor layer 24. The adhesion layer 22 is preferably comprised of tantalum pentoxide ($Ta_2O_5$). The adhesion layer could be selected from a group consisting of tantalum oxide, titanium oxide, zirconium oxide, hafnium oxide and vanadium oxide. The electrical conductor layer 24 is comprised of a noble metal, preferably platinum. The noble metal conductor could be selected from a group consisting of platinum, palladium, gold and rhodium. The electrical conductor layer 24 is attached to the top player 20 of the substrate 14 by the adhesion layer 22.

Adhesion of platinum (Pt) to glasses, such as silicon oxide ($SiO_2$), has been a longstanding problem. Traditionally, the adhesion issue has been dealt with by including a thin metallic adhesion layer between the platinum and the glass. This layer is typically composed of Ti, Cr, Ta, Va, Nb, Pd, Ir, Ru and is typically about 10% of the thickness of the platinum layer. Use of such adhesion layers results in very narrow process windows if the platinum electrode is to survive in oxidizing environments at temperatures above about 600° C. This is due to a combination of the tendency of platinum to plastic flow at these temperatures in response to stress and the poor performance of the platinum as a barrier to oxygen, which allows oxidation of the adhesion layer causing a volume expansion. This means that the typical metallic adhesion layer is an unstable surface for the platinum in this environment.

The most commonly used adhesion layer, titanium (Ti), has the further problem of migrating through the platinum electrodes. When used in an electrode for thin ceramic films, this causes stoiciometry changes and/or contamination issues which can result in degraded performance. Examples of this degradation include a reduction in relative permittivity for BST and reduced remnant polarization in SBTN or PZT.

The new electrode system of the present invention combines heated deposition, to control stresses in the metal layers, and oxidation of the adhesion layer before depositing the conductive layer. Oxidation of the adhesion layer before depositing the conductive layer prevents volume expansion from occurring during subsequent thermal processing. This results in a smooth, highly adherent surface which remains smooth during subsequent processing. Further, these electrodes show little sensitivity to variations in thickness of either the platinum or the adhesion layer, little sensitivity to the purity of the deposited materials, and little sensitivity to anneal processes. This allows use of thicker electrodes which, for many applications, are required for increased power/current handling or reduced resistive loss. These electrodes of the present invention remain smooth and planar even when exposed to very high compressive stresses and through anneals as long as 10 hours at 725° C. in oxygen. These electrodes also show higher remnant polarization (2Pr) in SBTN and lower leakage and higher breakdown fields in BST.

Figure 2:
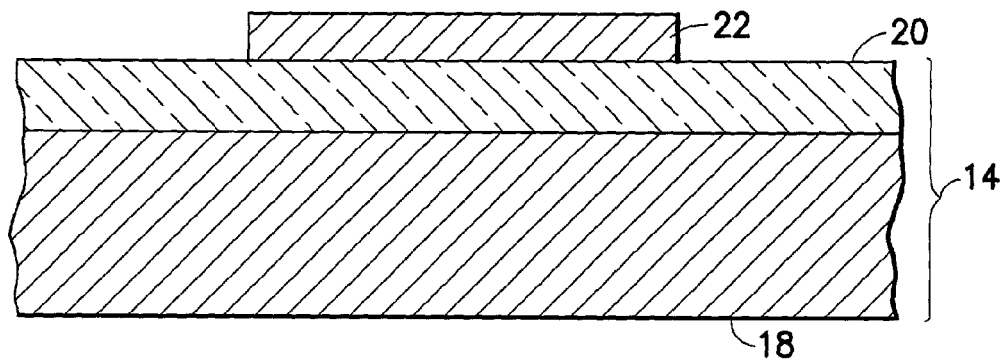
FIG. 2 is a schematic cross sectional diagram of the component shown in FIG. 1 before the electrode is formed.
Figure 3:
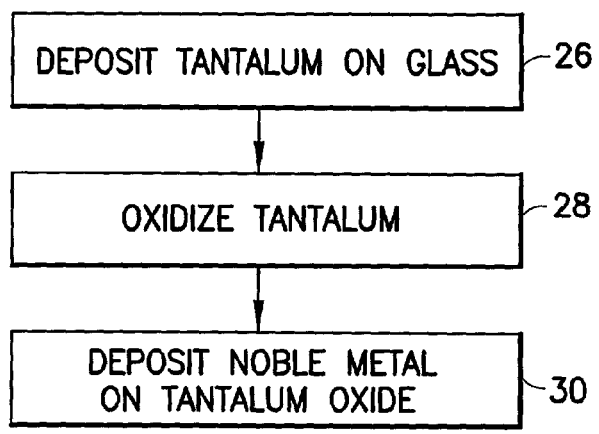
FIG. 3 is a process flow chart of steps used to form the component shown in FIG. 1.

Referring also to FIGS. 2 and 3, FIG. 2 shows the subcomponent 10 of FIG. 1 before the electrical conductor layer 24 is formed thereon. FIG. 3 illustrates some of the method steps used to form the subcomponent 10. As shown by block 26, tantalum is deposited on the top glass layer 20. After the tantalum is deposited on the top glass layer 20, the tantalum is then oxidized as illustrated by block 28. This forms the assembly as shown in FIG. 2. With the tantalum oxide 22 attached to the top glass layer 20, a noble metal (in this embodiment Pt) is deposited on the tantalum oxide as illustrated by block 30.

Figure 4:
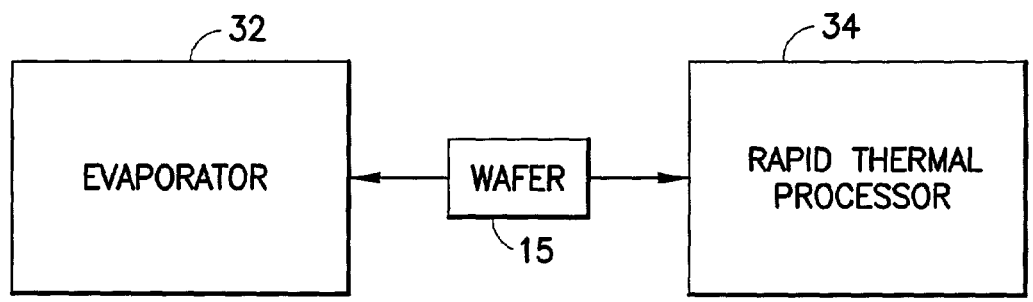
FIG. 4 is a diagram of some of the devices used to form the component shown in FIG. 1.

Referring also to FIG. 4, in a preferred method, an evaporator 32 is used for heated deposition of the tantalum and the platinum on the wafer which eventually forms the subcomponent 10. However, in alternate embodiments, the tantalum and the platinum could be deposited on the wafer by any suitable method, and perhaps by different methods. The evaporator 32 is preferably an e-beam evaporator which can heat the wafer 15 in a vacuum. However, in alternate embodiments, any suitable evaporator or metal deposition method could be used. In order to oxidize the tantalum, the system comprises a rapid thermal processor (RTP) 34. However, in alternate embodiments, any suitable device for oxidizing the tantalum could be used, including in-situ oxidations within the metal deposition system by the introduction of oxygen, direct evaporation of $TA_2O_5$ or reactive sputter of $TA_2O_5$ in an $O_2$ environment. The metal oxide adhesion layer may be deposited by direct sputtering of a metal oxide target; by vacuum deposition using MOCVD of an appropriate precursor; by spin-on deposition and firing of a MOD or sol-gel precursor; or by any method suitable for depositing metal oxide films. The rapid thermal processor can expose the wafer 15 to an elevated temperature for a predetermined time in an oxygen ambient atmosphere. This process completely oxidizes the metallic tantalum layer.

After the tantalum layer has been oxidized to form the tantalum oxide layer 22, the wafers 15 are then placed back into the evaporator 32 and heated to a predetermined temperature in a vacuum where the noble metal (Pt in the embodiment shown) layer can be deposited. In a preferred embodiment, the predetermined temperature is about 310 degrees Celsius. However, in alternate embodiments, any suitable temperature could be used. In a preferred embodiment, the platinum layer 24 has a thickness of about 2500 angstroms. However, in alternate embodiments, the platinum layer could have any suitable thickness. For example, the electrical conductor layer 24 could be from about 1600 angstroms to about 3500 angstroms.

Figure 5:
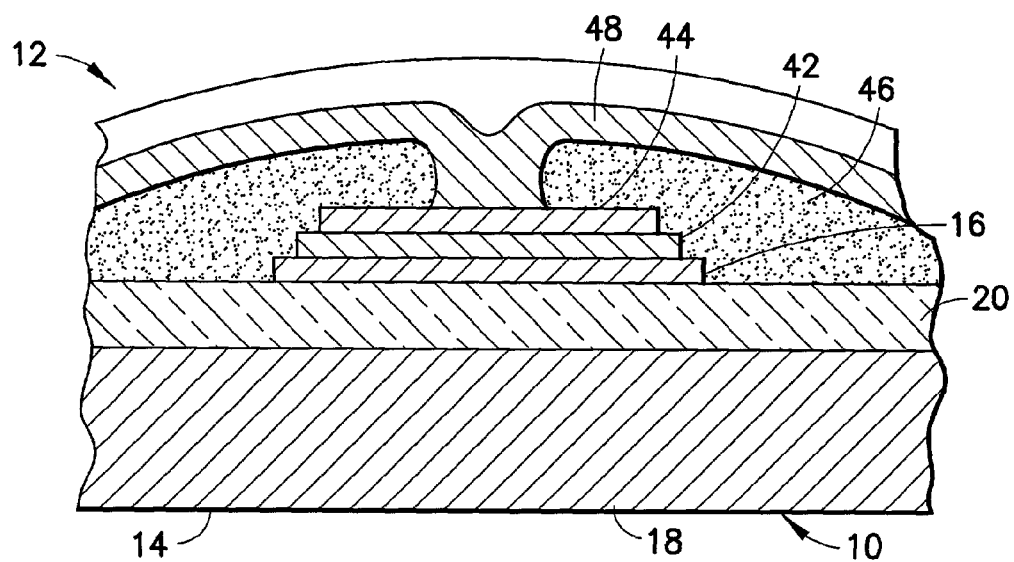
FIG. 5 is a schematic cross sectional diagram of a ferroelectric capacitor incorporating features of the present invention.

Referring now also to FIG. 5, the subcomponent 10 is shown as part of a ferroelectric capacitor 12. The capacitor 12 generally comprises the subcomponent 10, a ferroelectric layer (FE) 42, a top electrode (TE) 44, an interlayer dielectric (ILD) 46, and an interconnect metal (M3) 48. In the embodiment shown, the electrode 16 forms the bottom electrode for the capacitor 12. In a preferred embodiment, the electrode 16 is about 2500 Å. However, in alternate embodiments, the electrode could have any suitable thickness.

In the preferred embodiment shown, the ferroelectric layer 42 is about 2000 Å, the top electrode 44 is about 1100 Å, the inter layer dielectric 46 is about 3000 Å, and the interconnect metal 48 is about 1850 Å. However, in alternate embodiments, these components could have any suitable thickness. The ferroelectric thin film layer 42 could comprise barium titanate, strontium titanate, barium strontium titanate, lead zirconate titanate, strontium bismuth tantalate or strontium bismuth tantalate niobate. In the preferred embodiment shown, the top electrode 44 is comprised of platinum. However, in alternate embodiments, the top electrode 44 could comprise any suitable type of electrical conductor material. In the embodiment shown, the interlayer dielectric 46 is comprised of low pressure chemical vapor deposition (LPCVD) $SiO_2$. However, an alternate embodiments, the interlayer dielectric could be comprised of any suitable type of material and formed by any suitable method. In the embodiment shown, the interconnect metal 48 is comprised of platinum. However, in alternate embodiment, the interconnect metal 48 could be comprised of any suitable type of electrical conductor material.

The present invention can provide improved performance of thin-film dielectric and ferroelectric devices. Both leakage current and breakdown voltage of thin insulating films are dependant on the morphology of the underlying electrode. This invention allows the formation of a stable, smooth, and highly adherent electrode even with the relatively large thermal budgets required to produce high-quality ceramic thin films. Traditional films are marginal in adhesion and have a tendency to form a rough hillocked surface when exposed to high temperature oxidizing environments and high stresses.

This new adhesive layer comprises a metal oxide, for example $Ta_2O_5$, such as formed by evaporating tantalum metal and oxidizing it in a rapid thermal processor, as a stable adhesion layer before deposition of the platinum (or other noble metal) electrode. When this is combined with heated deposition of the platinum to control stresses, the electrode remains planar and very smooth over a wide range of anneal and process conditions. This electrode also appears to be quite insensitive to process variations such as thickness of the tantalum layer, tantalum anneal conditions, thickness of the platinum layer, and age of the platinum melt.

Ferroelectric devices fabricated on this new electrode show improved yield, higher breakdown resistance, and improved electrical properties when compared to previous conventional electrode structures. Use of this electrode structure has proven important to work on a BST varactor (such as described in U.S. Pat. No. 6,101,102) which requires very thick electrode layers to minimize resistive losses and high breakdown fields to achieve a wide tuning range and high current density.

In a preferred embodiment the substrate is a silicon wafer which has been wet oxidized to produce a 5000A thick $SiO_2$ film. The wafer is then placed in an e-beam evaporator and heated to a temperature of 250° C. in a vacuum. A tantalum layer, approximately 200A thick, is then evaporated onto the heated substrate. The system is vented and the wafer is allowed to cool. Neither the wafer temperature during evaporation nor the thickness of the tantalum layer are critical. The wafer is then removed from the system and the tantalum metal is oxidized by using a rapid thermal processor (RTP) to expose the wafer to a temperature of 725° C. for two minutes in an oxygen ambient atmosphere. Again, neither the time nor the temperature of this process is critical as long as the tantalum layer is fully oxidized.

Good results were achieved for anneal times from 1 to 7 minutes. The anneal temperature of 725° C. was chosen for convenience since 725° C. is the normal anneal temperature used for ferroelectric films. Other temperatures were not explored, but certainly could be possible. While use of an RTP to perform this oxidation was initially chosen for convenience, it is likely that the use of a RTP to perform this anneal might be preferred. Long furnace tube anneals may result in a smoother $Ta_2O_5$ surface with a large grain size which platinum may not adhere to very well.

After the tantalum layer has been oxidized, the wafer is then placed back into the evaporator and heated to a temperature of 310° C. in a vacuum where a platinum layer about 2500A thick is deposited. The thickness of the platinum layer is not critical. In tests, there has been success with platinum layer ranging from 1600A to 3500A and greater with this process. The temperature of the wafer during this deposition might be important due to its effect on the tensile stress of the wafers after cooling. Depositions at temperatures at or above 300° C. show an improvement in surface smoothness and adhesion compared to lower temperature depositions. This result in essentially featureless surfaces at magnifications up to 1000×. In a test of the process, maximum deposition temperature was limited by VITON™ seals in the vacuum system, so significantly higher temperature depositions have not been explored, but may be possible.

After venting and cooling, the wafer is removed from the vacuum system. At this stage the wafer is reasonably adherent and smooth. If necessary, improved adhesion can be obtained by a brief exposure to a higher temperature such as 30 seconds at 725° C. in an RTP, either as a separate anneal on the electrode only, or combined with the crystallization anneal on a subsequently deposited ferroelectric layer. The electrode surface will remain very smooth through the remainder of the ferroelectric processing including anneals totaling 10 hours at 725° C.

These improved electrodes have been tested with several ferroelectric materials including Bi containing ferroelectric films (SBT(N)) and BST films having very high tensile stress. The devices made with the improved electrodes have improved ferroelectric performance, leakage currents, and greater current handling ability. The use of metal oxides such as $Ta_2O_5$ as an adhesion layer for platinum electrodes used with ceramic thin films is not known to exist in the prior art.

As an overview of a capacitor array process, the process can comprises the following steps:
  Prepared starting wafer with 5000 Å wet oxidation
  Deposit Bottom Electrode (BE)
  Spin On Ferroelectric Precursor And Fire (FE)
  Deposit Top Electrode (TE)
  Etch Capacitor Stack
  Test Point 1 To Verify Good Ferroelectric Properties
  Deposit Interlayer Dielectric (ILD)
  Open Contacts (CT)
  Deposit Interconnect Metal (M3)
  Etch Interconnect Metal
  Test Point 2 To Screen For Yield
  Deposit Overglass
  Open Pads (GL)
  Final Parametric Test As an overview of the improved bottom electrode process of the present invention, the process can comprise the following steps:
  deposit Ta adhesion layer
    for example, 200A evaporated into wafer at 250° C.
  oxidize adhesion layer
    for example, RTA 2 minutes at 725° C. in $O_2$
  deposit Pt electrode
    for example, 2500A evaporated onto wafers at 310° C.
  if used in process without an RTP FE crystallization step, then an adhesion anneal may be desirable
    for example, RTA 30 seconds at 725° in $O_2$.

The improved electrodes of the present invention can provide many benefits. The electrodes can provide an improved performance, such as improved switching characteristics for ferroelectrics (2Pr, 2Ec), and larger NDRO signal for ferroelectrics. The electrodes can comprise smoother electrode surfaces both before and after FE firing. This can provide significantly improved yield, lower leakage current, and increased breakdown.

The improved electrode forming process can also allow thicker electrodes to be used. This can reduce conductive loss in electrodes which can dominate device performance at higher frequencies. The improved electrode forming process can provide larger process windows which are relatively insensitive to RTP oxidation time, Ta thickness, Pt thickness, and Pt purity. The present invention can provide benefits for a variety of materials such as SBTN, SBT and BST.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the claims.

What is claimed is:

1. A method of forming a conductor on a substrate consisting essentially of the sequential steps of:
   depositing tantalum directly on a glass layer of substantially uniform cross sectional thickness of the substrate;
   forming an adhesion layer of substantially uniform cross sectional thickness directly on the glass layer by oxidizing the deposited tantalum to form oxidized tantalum using at least one of a rapid thermal processor exposing the deposited tantalum to a predetermined temperature in an oxygen ambient environment or an in-situ oxidation within a metal deposition system; and
   depositing a noble metal directly and only on the oxidized tantalum at a temperature at or above 300° C. to form the conductor, and wherein the step of forming the adhesion layer comprises completely oxidizing the deposited tantalum.

2. A method as in claim 1 wherein the glass layer comprises silicon oxide.

3. A method as in claim 2 wherein the step of depositing tantalum on the glass layer comprises evaporating the tantalum directly onto the silicon oxide.

4. A method as in claim 1 wherein the step of depositing the noble metal comprises evaporating the noble metal directly onto the oxidized tantalum.

5. A method as in claim 1 wherein the step of depositing the noble metal comprises vapor deposition of the noble metal directly onto the oxidized tantalum.

6. A method as in claim 5 wherein the noble metal comprises platinum.

7. A method as in claim 1 wherein the step of depositing a noble metal on the oxidized tantalum comprises heated deposition of platinum directly on the oxidized tantalum.

8. A method as in claim 1 further comprising adhesion annealing the noble metal with the oxidized tantalum.

9. A method of forming a thin film ferroelectric device consisting essentially of the steps of:
   forming a conductor on a substrate as in claim 1, the conductor forming a bottom electrode of the thin film dielectric device;
   forming a ferroelectric layer on the bottom electrode; and
   forming a top electrode on the ferroelectric layer.

10. A method as in claim 1, wherein the glass layer is a wet oxidized portion of the substrate.

11. A method as in claim 1, wherein the substrate is a silicon wafer.

12. A method of forming a platinum, electrode on a silicon oxide substrate of substantially uniform cross sectional thickness consisting essentially of the sequential steps of:
   forming an adhesion layer of substantially uniform cross sectional thickness comprising oxidized tantalum, wherein tantalum is first deposited directly on said silicon oxide substrate and then oxidized using at least one of a rapid thermal processor exposing the tantalum to a predetermined temperature in an oxygen ambient environment or an in-situ oxidation within a metal deposition system, the adhesion layer being located directly on the silicon oxide; and
   directly depositing the platinum only on the adhesion layer by heated deposition at a temperature at or above 300° C. to form the platinum electrode, wherein the electrode is a bottom electrode of a thin film dielectric device, and wherein the step of forming the adhesion layer comprises completely oxidizing the deposited tantalum.

13. A method as in claim 12 wherein the step of forming the adhesion layer comprises heated vapor deposition of tantalum directly on the silicon oxide.

14. A method as in claim 13 wherein the step of forming the adhesion layer comprises oxidizing the tantalum in a rapid thermal processor before the platinum is deposited directly on the adhesion layer.

15. A method as in claim 12 wherein the step of directly depositing the platinum on the adhesion layer comprises evaporated deposition of the platinum in an evaporator.

16. A method of forming an electrode for a thin film capacitive device consisting of the sequential steps of:
   deposition of a metal oxide adhesion layer of substantially uniform cross sectional thickness directly and only on a top layer of substantially uniform cross sectional thickness of a glass substrate, wherein the metal oxide adhesion layer is formed by deposition of a metal followed by oxidation using at least one of a rapid thermal processor exposing the deposited metal to a predetermined temperature in an oxygen ambient environment or an in-situ oxidation within a metal deposition system; and
   deposition of a noble metal conductor directly and only on the metal oxide adhesion layer at a temperature at or above 300° C., wherein the electrode forms a bottom electrode of a thin film dielectric device, and wherein the step of forming the adhesion layer comprises completely oxidizing the deposited tantalum.

17. A method as in claim 16 wherein the metal oxide adhesion layer comprises tantalum oxide.

18. A method as in claim 16 wherein the metal oxide adhesion layer is deposited by sputtering of a metal oxide target.

19. A method as in claim 16 wherein the metal oxide adhesion layer is formed by MOCVD or MOD or sol-gel deposition of metal oxide precursors and subsequent thermal treatment.

20. A method as in claim 16 wherein the noble metal conductor is deposited by evaporation.

21. A method as in claim 16 wherein the noble metal conductor is deposited by evaporation onto a heated substrate.

22. A method of forming a conductor on a substrate consisting of the sequential steps of:
   directly depositing tantalum on a glass layer of substantially uniform cross sectional thickness of the substrate;
   forming an adhesion layer of substantially uniform cross sectional thickness directly on the glass layer by oxidizing the deposited tantalum to form oxidized tantalum using a rapid thermal processor exposing the deposited tantalum to a predetermined temperature in an oxygen ambient environment; and
   depositing a noble metal directly and only on the oxidized tantalum at a temperature at or above 300° C. to form the conductor, and wherein the step of forming the adhesion layer comprises completely oxidizing the deposited tantalum.

* * * * *